(12) United States Patent
Farnworth et al.

(10) Patent No.: US 6,232,243 B1
(45) Date of Patent: May 15, 2001

(54) INTERCONNECT HAVING RECESSED CONTACT MEMBERS WITH PENETRATING BLADES FOR TESTING SEMICONDUCTOR DICE AND PACKAGES WITH CONTACT BUMPS

(75) Inventors: Warren M. Farnworth, Nampa; Derek Gochnour; Salman Akram, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/226,052

(22) Filed: Jan. 5, 1999

Related U.S. Application Data (62) Division of application No. 08/829,193, filed on Mar. 31, 1997, now Pat. No. 5,962,921.

(51) Int. Cl.$^7$ ........................................ H01R 31/26
(52) U.S. Cl. ........................ 438/763; 438/14; 438/700; 438/706
(58) Field of Search ........................... 438/763, 734, 438/783, 700, 706, 10, 12, 18, 692; 427/644, 126.1

(56) References Cited

U.S. PATENT DOCUMENTS

| | | | |
|---|---|---|---|
| 4,937,653 | 6/1990 | Blonder et al. | 357/68 |
| 4,969,828 | 11/1990 | Bright et al. | 439/68 |
| 5,006,792 | 4/1991 | Malhi et al. | 324/158 F |
| 5,072,289 | 12/1991 | Sugimoto et al. | 357/68 |
| 5,088,190 | 2/1992 | Malhi et al. | 29/843 |
| 5,137,461 | 8/1992 | Bindra et al. | 439/74 |
| 5,172,050 | 12/1992 | Swapp | 324/158 P |
| 5,196,726 | 3/1993 | Nishiguichi et al. | 257/737 |
| 5,206,585 | 4/1993 | Chang et al. | 324/158 P |
| 5,249,450 | 10/1993 | Wood et al. | 72/359 |
| 5,289,631 | 3/1994 | Koopman et al. | 29/840 |
| 5,329,423 | 7/1994 | Scholz | 361/760 |
| 5,408,190 | 4/1995 | Wood et al. | 324/765 |
| 5,414,372 | 5/1995 | Levy | 324/765 |
| 5,420,520 | 5/1995 | Anschel et al. | 324/754 |
| 5,440,240 | 8/1995 | Wood et al. | 324/765 |
| 5,477,160 | 12/1995 | Love | 324/755 |
| 5,481,205 | 1/1996 | Frye et al. | 324/757 |
| 5,483,741 | 1/1996 | Akram et al. | 29/846 |
| 5,495,179 | 2/1996 | Wood et al. | 324/755 |
| 5,500,605 | 3/1996 | Chang | 324/758 |
| 5,523,696 | 6/1996 | Charlton et al. | 324/758 |
| 5,529,332 | 5/1996 | Wood et al. | 324/755 |
| 5,541,525 | 6/1996 | Wood et al. | 324/755 |
| 5,592,736 | 1/1997 | Akram et al. | 29/842 |
| 5,625,298 | 4/1997 | Hirano et al. | 324/754 |
| 5,629,837 | 5/1997 | Barabi et al. | 361/767 |
| 5,691,041 | 11/1997 | Frankeny et al. | 428/209 |
| 5,885,894 | * 3/1999 | Wu et al. | 438/763 |
| 5,888,844 | * 3/1999 | Bestwick | 438/706 |
| 5,904,523 | * 5/1999 | Feldman et al. | 438/763 |
| 5,962,921 | 10/1999 | Farnworth et al. | |
| 5,980,766 | * 11/1999 | Flamn | 438/706 |
| 5,997,634 | * 12/1999 | Sandhu et al. | 427/126.1 |

(List continued on next page.)

*Primary Examiner*—John F. Niebling
*Assistant Examiner*—Andrè C. Stevenson
(74) *Attorney, Agent, or Firm*—Stephen A. Gratton (57) ABSTRACT

An interconnect for establishing temporary electrical communication with semiconductor dice, or packages, having contact bumps is provided. The interconnect includes patterns of contact members adapted to receive the contact bumps. Each contact member includes a recess covered with a conductive layer in electrical communication with a conductor. The recesses include a peripheral edge sized to contact a range of bump sizes and to penetrate native oxide layers on the bumps. In addition, the contact members can include blades configured to penetrate into the bumps. The interconnect can be employed in a wafer level test system for testing dice contained on a wafer, or in a die level test system for testing bare dice or chip scale packages.

20 Claims, 6 Drawing Sheets

U.S. PATENT DOCUMENTS

| | | | |
|---|---|---|---|
| 6,008,137 | * 12/1999 | Lee | 438/734 |
| 6,016,060 | 1/2000 | Akram et al. . | |
| 6,033,970 | * 3/2000 | park | 438/437 |
| 6,034,420 | * 3/2000 | Tran | 257/644 |
| 6,054,340 | * 4/2000 | Mitchell | 438/700 |
| 6,060,891 | 5/2000 | Hembree et al. . | |
| 6,063,713 | * 5/2000 | Doan | 438/763 |
| 6,069,063 | * 5/2000 | Chang et al. | 438/783 |
| 6,091,252 | 7/2000 | Akram et al. . | |

* cited by examiner

INTERCONNECT HAVING RECESSED CONTACT MEMBERS WITH PENETRATING BLADES FOR TESTING SEMICONDUCTOR DICE AND PACKAGES WITH CONTACT BUMPS

CROSS REFERENCE TO RELATED APPLICATIONS

This application is a division of patent application No. 08/829,193 filed Mar. 31, 1997, now U.S. Pat. No. 5,962,921.

FIELD OF THE INVENTION

This invention relates generally to semiconductor manufacture, and more particularly to an improved interconnect, system and method for testing semiconductor dice and packages having contact bumps.

BACKGROUND OF THE INVENTION

One type of semiconductor die, referred to as a "bumped" die includes patterns of contact bumps formed on a face of the die. The contact bumps can be formed on wettable metal contacts on the die in electrical communication with the integrated circuits contained on the die. The contact bumps allow the die to be "flip chip" mounted to a substrate having corresponding solder wettable contacts. This mounting process was originally developed by IBM and is also known as the C4 joining process (Controlled Collapse Chip Connection).

Lead tin alloys (e.g., 95/5 lead tin alloy) and a ball limiting metallurgy (BLM) process can be used to form the bumps. Typically, the bumps are dome shaped, and have an average diameter of from 5 mils to 30 mils. Micro ball grid arrays (BGA) are formed in the smaller range, while standard ball grid arrays are formed in the larger size range. The sides of the bumps typically bow or curve outwardly from flat top surfaces. The flat top surfaces of the bumps form the actual regions of contact with the mating contacts on the substrate.

Contact bumps are also sometimes included in chip scale packages. In general, a "chip scale package" or "chip size package" refers to a package that includes a bare die along with one or more packaging elements. For example, chip scale packages can include thin protective members attached to the face, sides or backside of the die. In addition, chip scale packages can include contact bumps similar to the bumps on bumped dice. Some persons skilled in the art consider a bumped die the simplest form of a chip scale package.

With bumped dice and chip scale packages, it is sometimes necessary to make non-bonded, or temporary, electrical connections with the contact bumps. For example, in the production of Known Good Die (KGD), semiconductor manufacturers are required to test bumped dice prior to shipment. Temporary packages can be used to house a single bare die, or a chip scale package, for burn-in and other test procedure. These types of temporary packages are disclosed in U.S. Pat. Nos. 5,519,332; 5,541,525; 5,495,179; 5,440,240; and 5,408,190 to Wood et al.

Interconnects associated with the temporary packages can be used to electrically contact the bumps on the dice, or on the chip scale packages. With one type of interconnect, indentations on the interconnect can be sized to retain and electrically contact the bumps. For example, this type of interconnect can include a multi layered tape, similar to TAB tape manufactured by Nitto Denko and others. The tape can include a polyimide layer formed with patterns of indentations, and a metal layer subjacent to the indentations. The bumps fit into the indentations and electrically contact the metal layer.

To assist in making this temporary electrical connection, a temporary package can also include a force applying mechanism, such as a spring, adapted to bias the semiconductor component against the interconnect. A contact force must be generated by the force applying mechanism that is sufficient to break through the native oxide covering the bumps. If a sufficient contact force is not generated, then the resultant electrical connection can be poor. However, it is also advantageous to maintain this contact force as low as possible to avoid excessive deformation of the bumps. In particular, the loaded bumps exhibit creep during the burn-in cycles, which are typically performed at elevated temperatures for several hours or more.

In the past, following testing of dice with contact bumps, it has been necessary to reflow the bumps, which are typically damaged by the test procedure. This is an additional process step which adds to the expense and complexity of the testing process. Furthermore, it requires heating the tested dice which can adversely affect the integrated circuitry formed thereon.

Another consideration in testing bumped dice and chip scale packages is the dimensional variations between the contact bumps. The interconnect must be able to accommodate dimensional variations between bumps on different dice or packages, and dimensional variations between individual bumps on the same die or package. These dimensional variations can include the diameter, height, shape, and location of the bumps. In particular, the diameter and z-dimension location (planarity) of the bumps can make the electrical connections difficult to make without high contact forces.

Trapped gases can also cause problems during a reflow procedure. For example, gases can be trapped in cavities formed within the bumps. These trapped gas can expand during a reflow connection process causing the solder material to splatter.

In view of the foregoing, improved interconnects for making electrical connections to semiconductor dice and packages having contact bumps are needed. The present invention is directed to an improved interconnect able to provide a reliable electrical connection with the smallest contact bumps, while minimizing the deformation of the average and large sized contact bumps.

SUMMARY OF THE INVENTION

In accordance with the present invention, an improved interconnect adapted to establish temporary electrical communication with semiconductor components having contact bumps is provided. The semiconductor components can be bare bumped dice, bumped dice contained on a semiconductor wafer, or dice contained in chip scale packages having contact bumps. Also provided are a test system, and a testing method including the interconnect.

The interconnect includes a substrate having contact members for receiving and electrically contacting the contact bumps. Each contact member comprises a recess plated with a conductive layer in electrical communication with a corresponding conductor on the substrate. A peripheral edge of each recess is configured to penetrate into a contact bump retained in the recess, and to break through native oxide layers on the bump. In addition, the recesses can be shaped and dimensioned to contact the smallest bumps, as well as the largest bumps, with an acceptable amount of bump deformation. The dimensions of the recesses can be ascertained using statistical analysis of conventional bumps. In addition, the recesses can be formed with an elongated rectangular shape to permit the peripheral edges of the recesses to contact the bumps along a first axis (e.g., lateral axis) while permitting the bumps to flow along a second axis (e.g., longitudinal axis).

In an alternate embodiment, the contact members include blades projecting from the sidewalls of the recesses in a desired pattern (e.g., cross pattern, spoke pattern). The blades are shaped and dimensioned to penetrate only a portion of the bumps. This helps to minimize bump deformation and cavity formation in the bumps while forming reliable areas of electrical contact with the bumps. The recesses and blades can be formed with angled surfaces using an anisotropic etch process, or with rounded surfaces using an isotropic etch process. In addition, the blades can be contoured to match the topography of the contact bumps. This insures that the blades only minimally penetrate and deform the bumps.

The interconnect can be included in a wafer level test system, or a die level test system. In the wafer level test system, the interconnect can be mounted to a probe card fixture of a conventional testing apparatus, such as a wafer handler. During a test procedure, test circuitry associated with the testing apparatus can apply test signals through the interconnect to the integrated circuits on the dice. In addition, the test signals can be electronically switched as required to selected dice on the wafer. In the die level test system, the interconnect can be mounted to a temporary package configured to house a single bare die or a chip scale package. The temporary package can be mounted to a testing apparatus such as a conventional burn-in board configured to apply test signals through the interconnect to the die.

DETAILED DESCRIPTION OF THE PREFERRED EMBODIMENTS

Figure 1A:
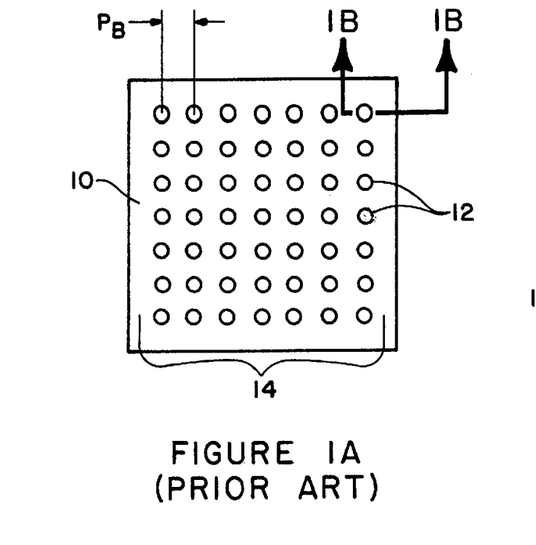
FIG. 1A is a plan view of a bumped semiconductor die including bumps arranged in a ball grid array (BGA)
Figure 1B:
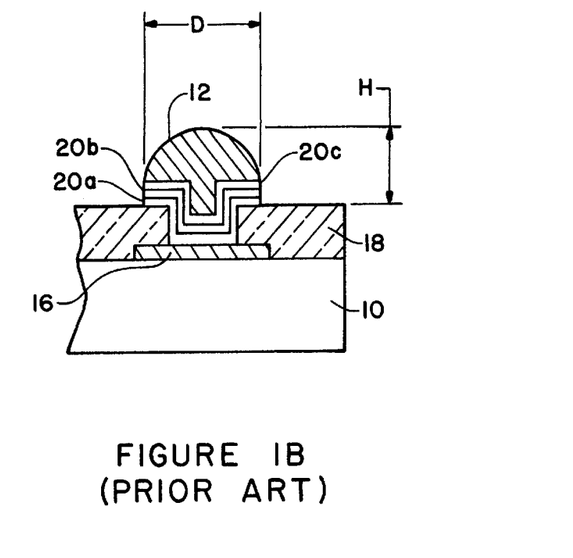
FIG. 1B is an enlarged cross sectional view of a bump taken along section line 1B—1B of FIG. 1A.

Referring to FIGS. 1A and 1B, a bumped semiconductor die 10 is shown. The die 10 includes a pattern of contact bumps 12 arranged in a ball grid array (BGA) 14. As shown in FIG. 1B, the die 10 also includes a passivation layer 18 and contacts 16 for the bumps 12. The contacts 16 are in electrical communication with the semiconductor devices and integrated circuits formed on the die 10.

Each bump 12 can be formed on a corresponding contact 16. In addition, each bump 12 can include a stack of underlying layers 20a–c. By way of example, layer 20a can be an adherence layer (e.g., Cr), layer 20b can be a solderable layer (e.g., Cu) and layer 20c can be a flash layer (e.g., Au). The bumps 12 can be formed by processes that are known in the art such as ball limiting metallurgy (BLM). Typically the bumps 12 are formed of a lead/tin solder (e.g., 95 Pb/5 Sn).

As shown in FIG. 1B, each bump 12 can be generally hemispherical, convex, or dome-shaped, with an outside diameter "D" and a height of "H". In general, the diameter "D" of the bumps 12 will be different for different bumps. Also the height "H" will be different causing non-planarity of the ball grid array 14 (FIG. 1A) in the z-direction. Still further, the pitch "$P_B$" (FIG. 1A) and location of the bumps 12 can vary. These dimensional variations will occur between the bumps on the same die and between the bumps on different dice, particularly different types of dice.

Figure 1C:
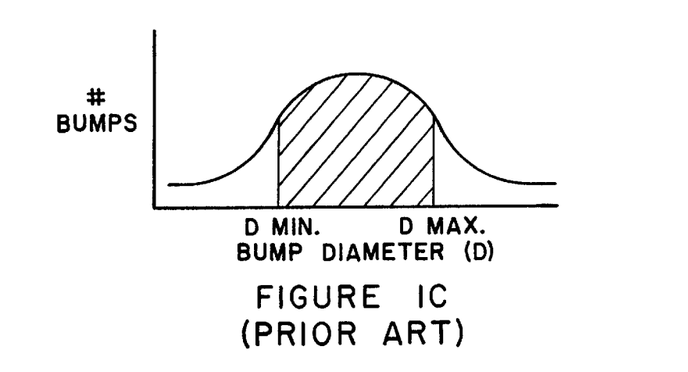
FIG. 1C is a graph illustrating a sampling of bumped semiconductor dice wherein an average minimum bump diameter ($D_{MIN}$) and an average maximum bump diameter ($D_{MAX}$) are ascertained.

As shown in FIG. 1C, measurement and statistical analysis techniques can be used to ascertain a range of bump diameters "D" for a particular type of die. FIG. 1C shows a simple analysis wherein an average minimum bump diameter ($D_{MIN}$) and an average maximum bump diameter ($D_{MAX}$) are ascertained. A similar analysis can be performed to ascertain an average minimum height ($H_{MIN}$) and an average maximum height ($H_{MAX}$). By determining a statistical average size range for the bumps, an interconnect can be constructed in accordance with the invention to accommodate a range of bumps sizes.

By way of example, a standard micro ball grid array (BGA) can include bumps having an average minimum bump diameter ($D_{MIN}$) of about 4.5 mils and an average maximum bump diameter ($D_{MAX}$) of about 5.5 mils. An average bump diameter ($D_{AVG}$) can be about 5.0 mils. An average minimum height ($H_{MIN}$) can be about 2.8 mils and an average maximum height ($H_{MAX}$) about 4.2 mils. An average height ($H_{AVG}$) can be about 3.7 mils.

Figure 1D:
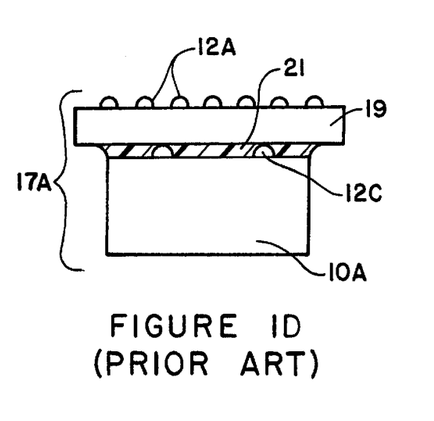
FIG. 1D is a schematic cross sectional view of a chip scale package having contact bumps.
Figure 1E:
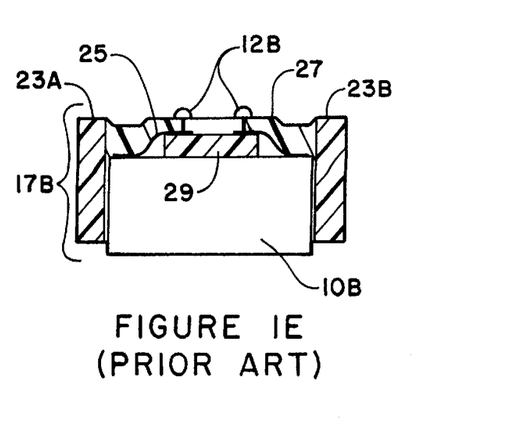
FIG. 1E is a schematic cross sectional view of another chip scale package having contact bumps.

Referring to FIGS. 1D and 1E, a die can also be contained within a chip scale package 17A (FIG. 1D) or a chip scale package 17B (FIG. 1E). In FIG. 1D, the chip scale package 17A comprises a semiconductor die 10A, and a BGA substrate 19 bonded to the face of the die 10A using an adhesive layer 21. The BGA substrate 19 includes bumps 12A in electrical communication with bumps 12C on the die 10A. The bumps 12A on the BGA substrate 19 are substantially equivalent to the bumps 12 (FIG. 1B) previously described.

In FIG. 1E, the chip scale package 17B includes a semiconductor die 10B, and protective members 23A, 23B bonded to either side of the die 10B. In addition, the chip scale package 17B includes bumps 12B in electrical communication with the die bond pads via leads 25. An encapsulant 27 and an elastomeric pad 29 electrically isolate the leads 25 and bumps 12B. As is apparent these configurations are merely exemplary and other chip scale package configurations are common in the art.

Figure 2A:
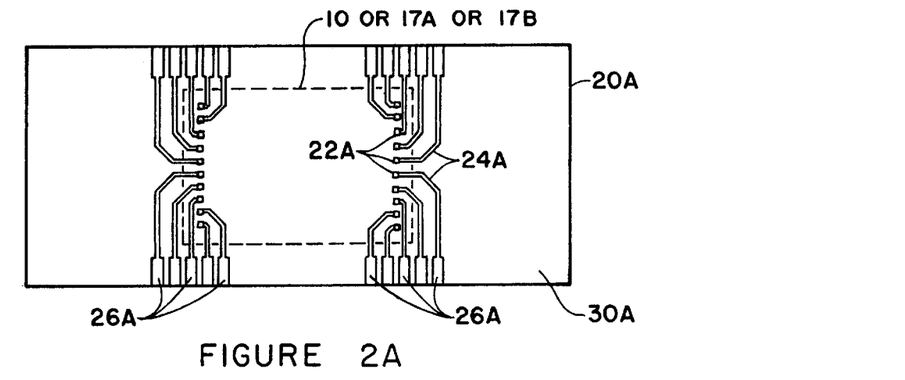
FIG. 2A is an enlarged plan view of a die level interconnect constructed in accordance with the invention.
Figure 2B:
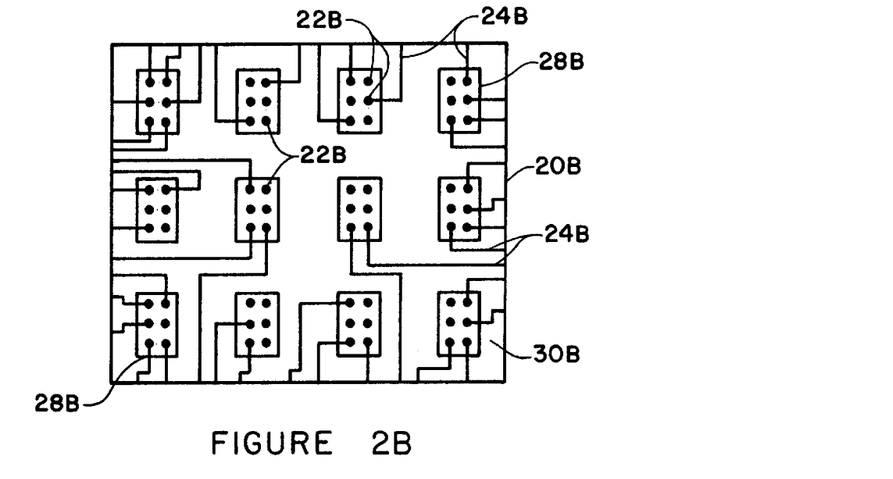
FIG. 2B is a plan view of a wafer level interconnect constructed in accordance with the invention adapted to test multiple dice on a semiconductor wafer.
Figure 2C:
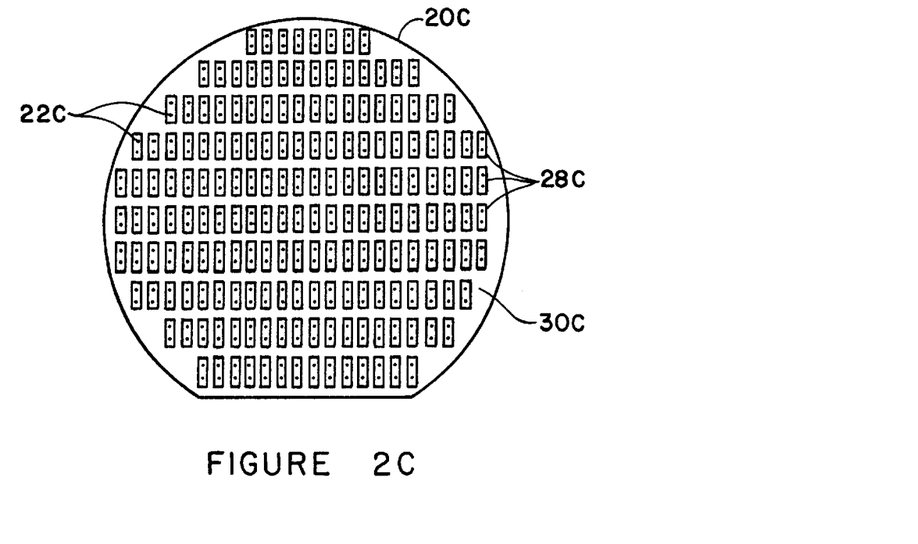
FIG. 2C is a plan view of a wafer level interconnect constructed in accordance with the invention adapted to test all of the dice on a semiconductor wafer.

Referring to FIGS. 2A–2C, different interconnects constructed in accordance with the invention are illustrated. In FIG. 2A, an interconnect 20A is configured to test a single semiconductor die, such as a bare bumped die (e.g., 10—FIG. 1), or a die contained in a chip scale package (e.g., 17A—FIG. 1D or 17B—FIG. 1E). In FIG. 2B, an interconnect 20B is configured to test a group of dice, such as an array of dice contained on a wafer, or other semiconducting substrate. In FIG. 2C, an interconnect 20C is configured to test all of the dice on an entire semiconductor wafer.

As shown in FIG. 2A, interconnect 20A includes patterns of contact members 22A formed on a substrate 30A. The contact members 22A are configured to establish electrical communication with the bumps 12 (FIG. 1B) on the bumped die 10 (or the bumps 12A and 12B on chip scale packages 17A and 17B). In FIG. 2A, simple peripheral patterns of contact members 22A are shown. However, it is to be understood that the patterns of contact members 22A on the interconnect 20A will correspond to the patterns of the bumps 12. Thus if the bumps 12 are arranged in a ball grid array, the contact members 22A can be arranged in a corresponding array. Further details of the contact members 22A will become more apparent as the description proceeds.

Still referring to FIG. 2A, the interconnect 20A also includes patterns of conductors 24A in electrical communication with the contact members 22A. The conductors 24A provide conductive paths to and from the contact members 22A. As will be further explained, the conductors 24A can comprise thin film conductive traces formed on the substrate 30A of the interconnect 20A. In addition, the conductors 24A can include bonding pads 26A that enable a separate electrical connection, such as a wire bond, to be made to each conductor 24A.

Referring to FIG. 2B, the interconnect 20B includes sixteen separate patterns 28B of contact members 22B formed on a substrate 30B. Each contact member 22B is configured to electrically connect to a corresponding bump. However, in this case the bumps are contained on a semiconductor wafer or other semiconducting substrate. In addition, each contact member 22B includes an associated conductor 24B. The separate patterns 28B of contact members 22B correspond to the locations of the dice on a wafer or other semiconducting substrate. Although sixteen separate patterns 28B of contact members 22B are illustrated, it is to be understood that a greater or lesser number of patterns 28B can be employed. Also for simplicity, six contact members 22B per pattern 28B are illustrated. However, each pattern 28B can include enough contact members 22B to simultaneously contact all of the bumps (e.g., 12—FIG. 1B) on a particular die. As will be further explained, wafer stepping techniques can be employed to step the interconnect 20B across a wafer to test multiple dice at one time and eventually all of the dice on the wafer.

Referring to FIG. 2C, an interconnect 20C includes multiple patterns 28C of contact members 22C formed on a substrate 30C. The patterns 28C correspond to the locations of bumped dice on a semiconductor wafer, and are configured to contact all of the dice on the wafer at the same time. Test signals can then be electronically applied through the contact members 22C, and switched as required, until all of the dice on the wafer have been tested. For simplicity only, two contact members 22C per pattern 28C are illustrated. However, each pattern 28C can include enough contact members 22C to simultaneously contact all of the bumps on a particular die. Also for simplicity, conductors to the contact members 22C are not illustrated. However, it is to be understood that each contact member will have an associated conductor as previously explained.

Figure 3:
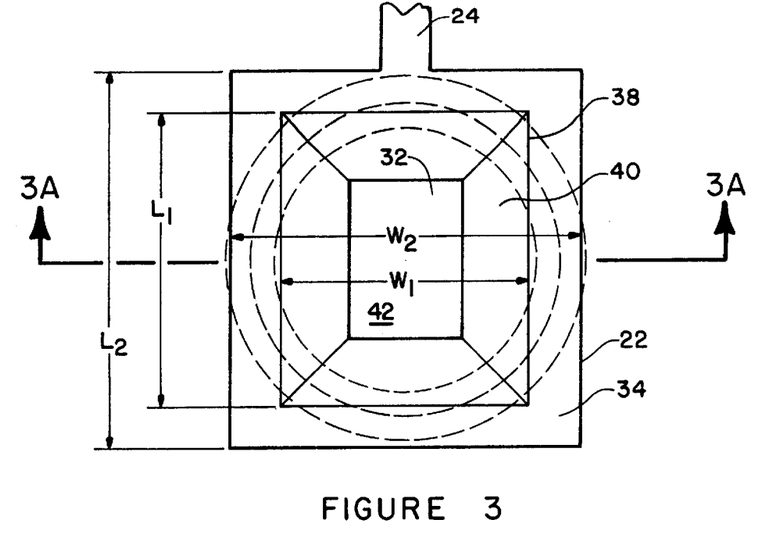
FIG. 3 is an enlarged plan view of a contact member on an interconnect constructed in accordance with the invention.
Figure 3A:
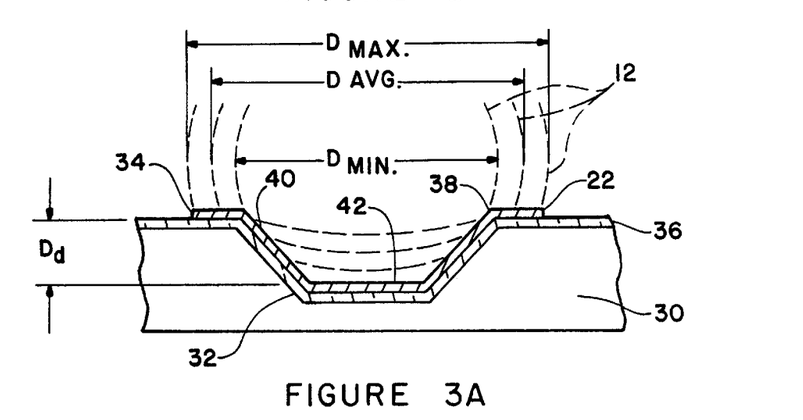
FIG. 3A is an enlarged cross sectional view of the contact member taken along section line 3A—3A of FIG. 3.
Figure 3B:
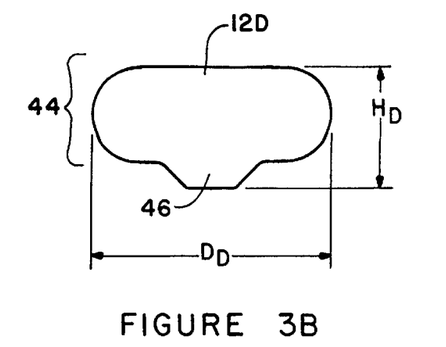
FIG. 3B is an enlarged cross sectional view of a bump retained within the contact member illustrating the deformation thereof.
Figure 3C:
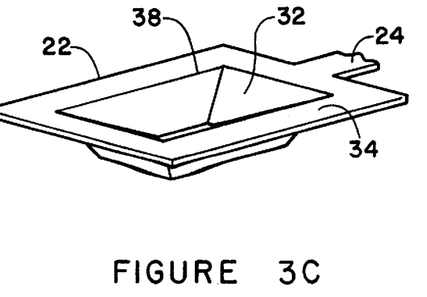
FIG. 3C is an enlarged perspective view of the contact member shown in FIGS. 3 and 3A.

Referring to FIGS. 3–3C, an individual contact member 22 is illustrated in greater detail. The contact member 22 can be formed on a die level interconnect 20A (FIG. 2A), a multiple dice interconnect 20B (FIG. 2B), or a wafer level interconnect 20C (FIG. 2C).

The contact member 22, generally stated, comprises a recess 32 formed in a substrate 30, and a conductive layer 34 covering the recess 32. The conductive layer 34 is in electrical communication with a conductor 24 formed on the substrate 30. In addition, an insulating layer 36 (FIG. 3A) is formed on the substrate 30 to electrically isolate the conductive layer 34 and conductor 24 from the bulk of the substrate 30.

The substrate 30 can be formed of a material having a coefficient of thermal expansion (CTE) that matches, or closely approximates the CTE of semiconductor dice. Suitable materials include silicon, germanium and ceramic. The recess 32 can be etched, laser drilled or otherwise formed in the substrate 30. In addition, the recess 32 can be square, rectangular, elongated rectangular, circular or oval shaped.

With the substrate 30 formed of silicon, the recess 32 can be formed by forming a mask (not shown) on the substrate 30 and then etching with a wet or dry etchant. The etch process can be either anisotropic or isotropic. With an anisotropic etch process the recess 32 will have straight sidewalls 40, sloped at an angle of about 55° with respect to the surface of the substrate 30 substantially as shown in FIG.

3A. One suitable etchant for performing an anisotropic etch of a silicon substrate 30 is a solution of KOH:$H_2O$. With an isotropic etch process, the recess 32 will have curved sidewalls (not shown). One suitable etchant for performing an isotropic etch of a silicon substrate 30 is a mixture of HF, $HNO_3$ and $H_2O$.

Also, with the substrate 30 formed of silicon, the insulating layer 36 (FIG. 3A) can be a grown or deposited layer of $SiO_2$. With the substrate 30 formed of an insulating material such as ceramic, the insulating layer 36 is not required.

The contact member 22 includes a peripheral edge 38 configured to break through any native oxide covering the bump 12. The peripheral edge 38 is formed by the edge of the recess 32 and is covered by the conductive layer 34. The recess 32 and peripheral edge 38 are sized and shaped to compensate for large variations in the diameter (D), height (H), volume (V), shape, and planarity of the bumps 12 (FIG. 1B). In particular, the width "W1" (FIG. 3) and length "L1" (FIG. 3) of the peripheral edge 38 can be selected such that a bump 12 with an average minimum bump diameter ($D_{MIN}$) can be electrically contacted. At the same time, a bump 12 having an average maximum bump diameter ($D_{MAX}$) can also be electrically contacted by the peripheral edge 38 but with a minimal amount of bump deformation.

Preferably the width "W1" of the peripheral edge 38 is slightly less than the average minimum bump diameter ($D_{MIN}$). As previously explained, the average minimum bump diameter ($D_{MIN}$) can be an average of all bumps 12 for a particular die 10, determined by statistical analysis. In the previous example for a micro BGA, the average minimum bump diameter ($D_{MIN}$) can be about 4.5 mils. Accordingly, the width "W1" can be less than this value (e.g., 4.4 mils).

The length "L1" of the peripheral edge 38 can be equal to, less than, or greater than the width "W1". However, with the length "L1" greater than the width "W1", the contact member 22 is generally elongated or rectangular in shape. This elongated shape permits the bump 12 to deform into the recess 32 without being excessively compacted. In other words, the recess 32 has a shape that allows the bump 12 to be in electrical contact along a first axis (e.g., lateral axis) and at the same time flow along a second orthogonal axis (e.g., longitudinal axis).

A depth "$D_D$" of the recess 32 can be selected to provide a minimal amount of deformation of the bumps 12. Preferably the depth "$D_D$" is substantially less than the average height "H" (FIG. 1B) of the bumps 12. By way of example the depth "$D_D$" can be from 1% to 75% of the average height "H" (FIG. 1B) of the bump 12.

The conductive layer 34 covers the sidewalls 40 and bottom surface 42 of the recess 32 and an area on the substrate 30 surrounding the recess 32. In addition, the conductive layer 34 is in electrical communication with an associated conductor 24 formed on the substrate 30. In FIG. 3, the conductive layer 34 is generally rectangular in shape with a length "$L_2$" and a width "$W_2$". The length "$L_2$" and width "$W_2$" can be selected to insure that bumps 12 having a maximum diameter ($D_{MAX}$) preferably do not extend past a perimeter of the conductive layer 34.

The conductive layers 34 and conductors 24 can be formed of highly conductive metal such as aluminum, iridium, copper, gold, tungsten, tantalum, molybdenum or alloys of these metals. The conductive layers 34 and conductors 24 can be formed using a suitable metallization process (e.g., deposition, photopatterning, etching). If desired separate metallization processes can be used for the conductive layers 34 and conductors 24. In addition, the conductive layers 34 and conductors 24 can be formed as multi-layered stacks of metals (e.g., bonding layer/barrier layer). Still further, the conductors 24 can be electrically insulated with an outer insulating layer (not shown).

The conductive layers 34 can also be formed of a material that is non-reactive with the bumps 12. For bumps 12 formed of solder, suitable materials for the conductive layers 34 include Be, Mg, Ca, Sr, Ba, Sc, Y, La, Ti, Zr, Hf, V, Nb, Ta, Mo, W, Tc, Re, B, C, Si, Ge and alloys of these materials.

Some of these materials, such as the metals, can be easily plated or metallized in suitable patterns. An exemplary metallization process is disclosed in U.S. Pat. No. 5,607,818, incorporated herein by reference. Other of the above materials can be deposited as alloys or in combination with other elements. For example, the conductive layers 34 can comprise a metal silicide such as $TiSi_2$, $WSi_2$, $TaSi_2$, $MoSi_2$, $PtSi_2$. In this case, a silicon containing layer and a metal layer can be deposited and then reacted to form a metal silicide. An exemplary metal silicide deposition process is disclosed in U.S. Pat. No. 5,483,741, incorporated herein by reference. Still further, other alloys such as TiN, TiW, TiC and NiB can be deposited using CVD or other deposition process.

FIG. 3B illustrates the shape of a deformed bump 12D that has been placed within the contact member 22. In general, the deformed bump 12D is larger in diameter than the original bump 12 (FIG. 1B). In particular, the bump 12D includes a portion 44 that has a diameter ($D_D$) that is greater than the original diameter (D) of the bump 12 (FIG. 1B). In addition, the deformed bump 12D includes a portion 46 that has a shape substantially similar to the shape of the recess 32.

A height $H_D$ of the deformed bumps 12D will be less than the original height "H" of the bumps 12 (FIG. 1B). Additionally, even though the original height "H" (FIG. 1B) of the bumps 12 can vary, the height $H_D$ of the deformed bumps 12D will be substantially the same. The contact member 22 thus functions to planarize the bumps 12 on the die 10. At the same time the deformed bumps 12D will function adequately for most applications without requiring a reflow process.

Figure 4A:
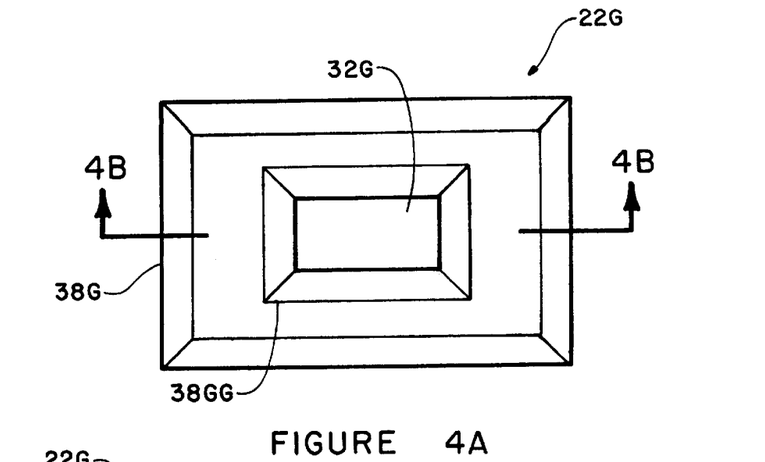
FIG. 4A is an enlarged plan view of an alternate embodiment contact member having a stepped recess.
Figure 4B:
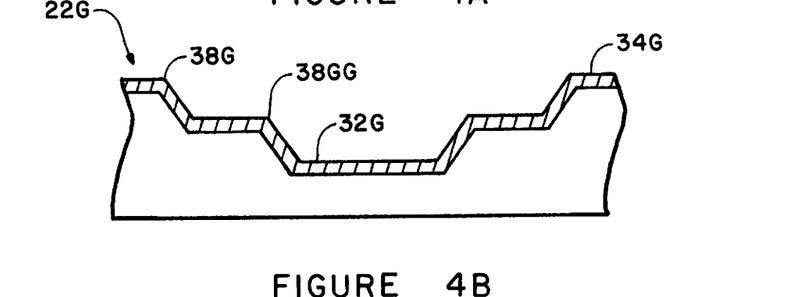
FIG. 4B is an enlarged schematic cross sectional view taken along section line 4B—4B of FIG. 4A.

Referring to FIGS. 4A and 4B, an alternate embodiment contact member 22G is formed substantially as previously described for contact member 22 (FIG. 3). However, contact member 22G includes a stepped recess 32G covered with a conductive layer 34G. The stepped recess 32G includes a first peripheral edge 38G and a second peripheral edge 38GG. The peripheral edges 38G, 38GG function substantially as previously described for peripheral edge 38 (FIG. 3C) but allow a single bump 12 to be penetrated at multiple locations.

Figure 4C:
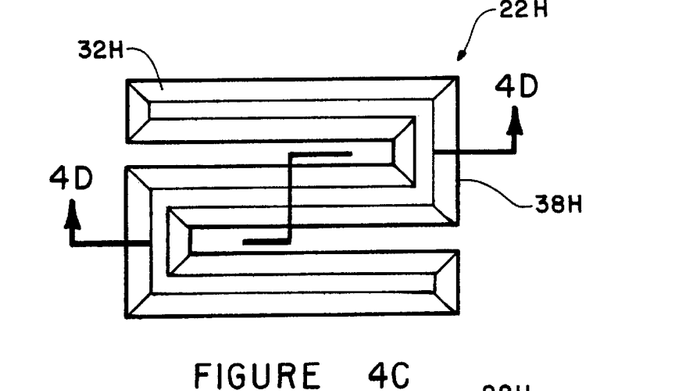
FIG. 4C is an enlarged plan view of an alternate embodiment contact member having a serpentine recess.
Figure 4D:
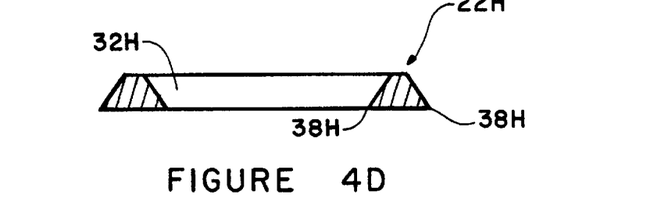
FIG. 4D is an enlarged schematic cross sectional view taken along section line 4D—4D of FIG. 4C.

Referring to FIGS. 4C and 4D, an alternate embodiment contact member 22H is formed substantially as previously described for contact member 22 (FIG. 3) but includes a serpentine recess 32H. The serpentine recess 32H includes a serpentine peripheral edge 38H adapted to penetrate the bumps 12 in a serpentine pattern. In FIG. 4D the conductive layer is omitted for clarity.

Figures 5, 6:
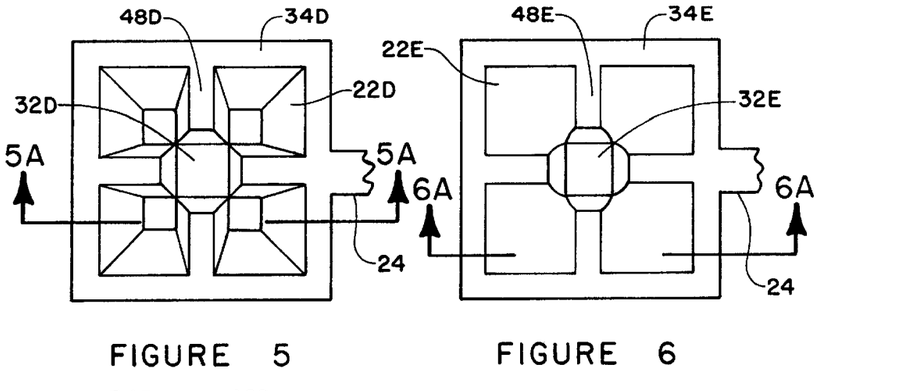
FIG. 5 is an enlarged plan view of an alternate embodiment contact member having blades formed using an anisotropic etch process.
FIG. 6 is an enlarged plan view of an alternate embodiment contact member having blades formed using an isotropic etch process.
Figure 5A:
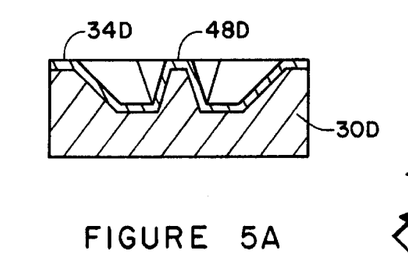
FIG. 5A is an enlarged cross sectional view taken along section line 5A—5A of FIG. 5.

Referring to FIGS. 5 and 5A, an alternate embodiment contact member 22D is illustrated. Contact member 22D is formed substantially as previously described for contact member 22 (FIG. 3). In particular, the contact member 22D comprises a recess 32D etched into a substrate 30D and covered with a conductive layer 34D. However, the contact member 22D also includes blades 48D configured to penetrate into the bumps 12 (FIG. 1B) on the die 10. In FIGS. 5 and 5A, an insulating layer equivalent to insulating layer 36 (FIG. 3A) is omitted for clarity.

The blades 48D can be formed at the same time as the recess 32D using the same etch mask. For the blade pattern shown in FIG. 5, the etch mask can comprise five squares. Using an anisotropic etch process, the recess 32D and blades 48D will have sloped sidewalls (e.g., 55°) substantially as shown in FIGS. 5 and 5A. The height of the blades 48D can be substantially equal to the depth of the recess 32D as shown, or can be less than the depth of the recess 32D (not shown). Preferably the height of the blades 48D is from 5% to 50% of the diameter "D" (FIG. 1B) of the bumps 12.

In addition, the blades 48D extend into the recess 32D and are located to contact a portion (e.g., 46—FIG. 3B) of the bumps 12. However, the blades 48D can be sized to not excessively damage the bumps 12 nor to leave a large void in the bumps 12. Voids can trap gases during subsequent processes causing bump deformation and other problems. Still further, the blades allow gases to escape from the area between the contact member 22D and bump 12 during the test procedure.

In the embodiment illustrated in FIGS. 5 and 5A, there are four blades 48D arranged in a cross (+) pattern. However, other blade numbers and blade patterns are also possible. For example, the blades 48D can be formed in radial patterns or spoke-like patterns. Still further, two or more blades can be formed on either side of the recess 32D rather than on four sides.

Figure 6A:
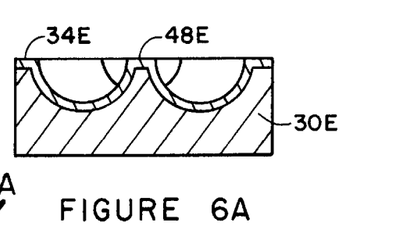

Referring to FIGS. 6 and 6A, an alternate embodiment contact member 22E is illustrated. Contact member 22E can be formed substantially as previously described for contact member 22D (FIG. 5). In particular, the contact member 22E comprises a recess 32E etched into a substrate 30E and covered with a conductive layer 34E. In addition, the contact member 22E includes a pattern of blades 48E. However, in this case an isotropic etch process can be used to form the recess 32E and blades 48E. The recess 32E and blades 48E will thus have a curved or radiused shape as is typical with an isotropic etch process.

Figure 7:
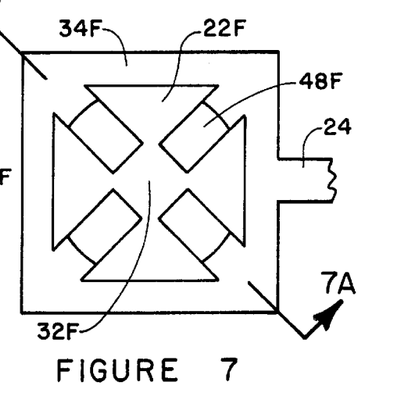
FIG. 7 is an enlarged plan view of an alternate embodiment contact member having contoured blades formed in a radial pattern.
Figure 7A:
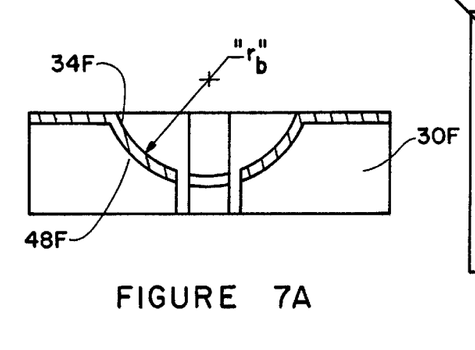
FIG. 7A is an enlarged cross sectional view taken along section line 7A—7A of FIG. 7.
Figure 7B:
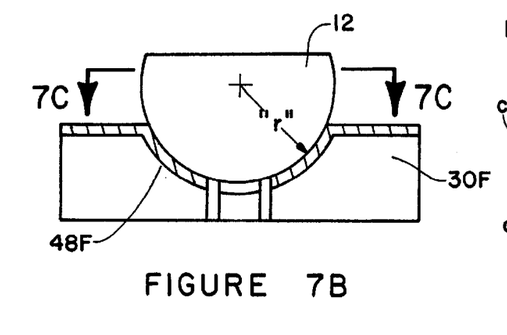
FIG. 7B is an enlarged cross sectional view equivalent to FIG. 7A but showing a contact bump in electrical contact with the contact member.
Figure 7C:
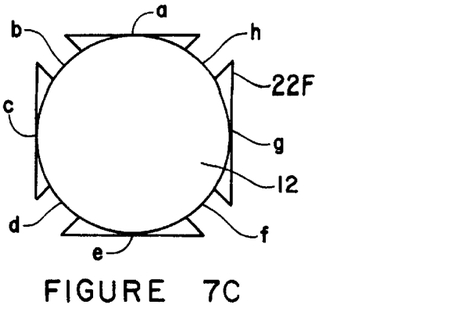
FIG. 7C is an enlarged cross sectional view taken along section line 7C—7C of FIG. 7B.

Referring to FIGS. 7–7C, an alternate embodiment contact member 22F is illustrated. Contact member 22F can be formed substantially as previously described for contact member 22E (FIG. 6). In particular the contact member 22F comprises a recess 32F etched into a substrate 30F and covered with a conductive layer 34F. In addition, the contact member 22F includes a pattern of blades 48F. The blades 48F are formed in a radial pattern from the corners of the recess 32F. In addition, the blades 48F are formed with a radius of curvature "$r_b$" (FIG. 7A) that is approximately equal to the radius of curvature "r" (FIG. 7B) of the bump 12.

The surface contour of the blades 48F thus matches the surface contour of the bumps 12. This helps to minimize bump deformation because penetration of the blades 48F into the bumps 12 can be minimized. In addition, as shown in FIG. 7C, at least seven contact points (a, b, c, d, e, f, g) are formed between the contact member 22F and the bump 12. The contact member 22F can be formed as previously described using an isotropic etch process but with separate masks for the blades 48F and recess 32F.

Wafer Level System

Figure 8A:
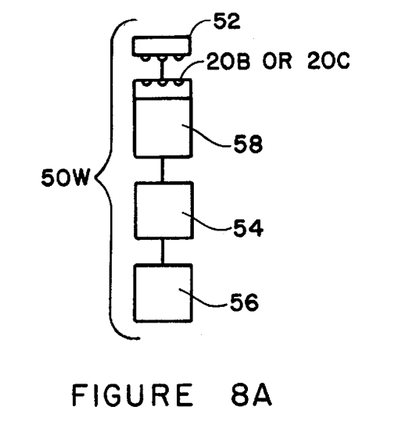
FIG. 8A is a block diagram of a wafer level test system constructed in accordance with the invention.
Figure 8B:
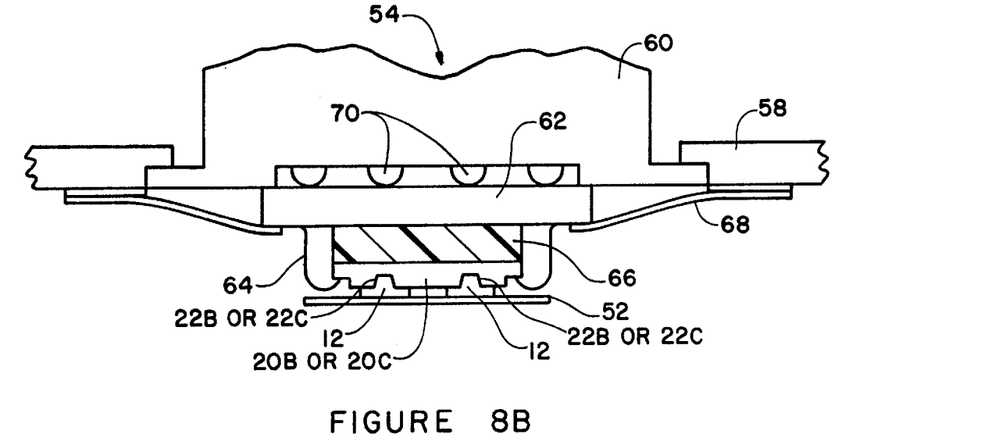
FIG. 8B is a schematic cross sectional view of the wafer level test system.

Referring to FIGS. 8A and 8B, a wafer level test system 50W is illustrated. The wafer level test system 50W is configured to test bumped semiconductor dice (e.g., 10—FIG. 1A) contained on a semiconductor wafer 52 or other semiconductor substrate. The wafer level test system 50W includes the interconnect 20B or 20C constructed in accordance with the invention as previously described, and mounted to a testing apparatus 54.

The testing apparatus 54 includes or is in electrical communication with testing circuitry 56. The testing apparatus 54 can be a conventional wafer probe handler, or probe tester, modified for use with the interconnect 20B or 20C. Wafer probe handlers and associated test equipment are commercially available from Electroglass, Advantest, Teradyne, Megatest, Hewlett-Packard and others. In this system 50W, the interconnect 20B or 20C takes the place of a conventional probe card.

As shown in FIG. 8B, the interconnect 20B or 20C includes contact members 22B or 22C configured to establish electrical communication with the bumps 12 on the wafer 52. The contact members 22B or 22C on the interconnect 20B or 20C are formed in patterns 28B (FIG. 2B) or 28C (FIG. 2C) that match the patterns of the bumps 12 on the wafer 52.

With interconnect 20B, the testing apparatus 54 can be used to step the wafer 52, or to step the interconnect 20B, so that the dice can be tested in groups until all of the dice on the wafer 52 have been tested. Alternately, with interconnect 20B the contact members 22C can be configured to contact every bump 12 for all of the dice on the wafer 52 at the same time. Test signals can then be selectively applied and electronically switched as required, to selected dice on the wafer 52.

As shown in FIGS. 8B, the interconnect 20B or 20C can mount to a probe card fixture 58 of the testing apparatus 54. The probe card fixture 58 can be similar in construction to a conventional probe card fixture commercially available from manufacturers such as Packard Hughes Interconnect and Wentworth Laboratories. The probe card fixture 58 can be formed of an electrically insulating material such as FR-4 or ceramic. In addition, the testing apparatus 54 can include a force applying mechanism 60 associated with the probe card fixture 58.

The interconnect 20B or 20C can be mounted to a mounting plate 62 in contact with force application members 70 of the force applying mechanism 60. The force application members 70 can be spring loaded pins or equivalent elements. In addition, a biasing member 66 formed of an elastomeric material, or as a gas filled bladder, can be mounted between the mounting plate 62 and interconnect 20B or 20C.

Still further, conductive paths 68 can be formed from the probe card fixture 58 to the mounting plate 62. By way of example, the conductive paths 68 can comprise multi layered tape with laminated conductors similar to TAB tape, or ASMAT manufactured by Nitto, Denko. In addition, bond wires 64 can be used to electrically connect the conductors on the mounting plate 62 to the conductors (e.g., 24—FIG. 3) for the contact members 22B or 22C.

Further details of a wafer level system similar to the system 50W are contained in U.S. patent application No. 08/797,719, filed Feb. 10, 1997, now U.S. Pat. No. 6,060,891 entitled "PROBE CARD FOR SEMICONDUCTOR WAFERS AND METHOD AND SYSTEM FOR TESTING WAFERS" which is incorporated herein by reference.

Die Level Test System

Figure 9A:
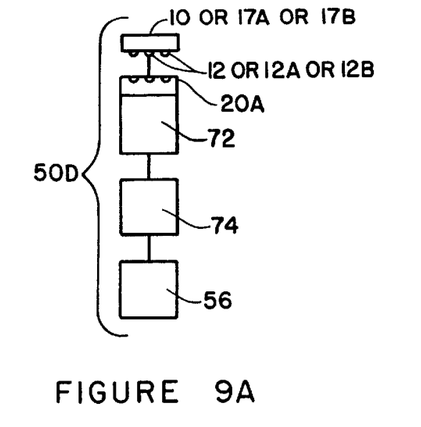
FIG. 9A is a block diagram of a die level test system constructed in accordance with the invention.
Figure 9B:
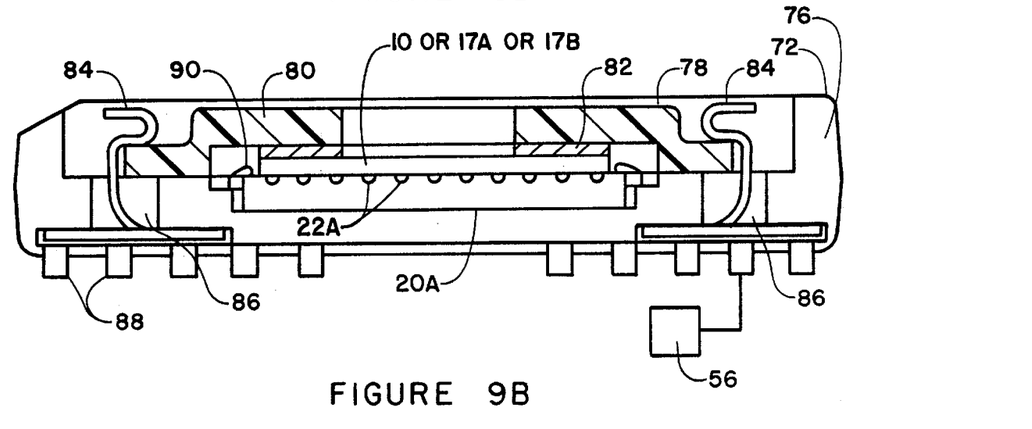
FIG. 9B is a schematic cross sectional view of the die level test system.

Referring to FIGS. 9A and 9B, a die level test system 50D is shown. The die level test system 50D is configured to test a singulated semiconductor die 10, or chip scale package 17A or 17B. The die level test system 50D includes a temporary package 72, the interconnect 20A, and a testing apparatus 74 in electrical communication with testing circuitry 56.

The temporary package 72 is configured to house the die 10, or chip scale package 17A or 17B, in electrical communication with the interconnect 20A. The interconnect 20A mounts to the temporary package 72 and is configured to provide a temporary electrical connection with the contact bumps 12A or 12B or 12C. The testing apparatus 74 can be a test socket on a burn-in board or similar apparatus used for testing conventional semiconductor packages.

As shown in FIG. 9B, the temporary package 72 includes a base 76 and a force applying mechanism 78. The force applying mechanism 78 secures the die 10, or chip scale package 17A or 17B, to the base 76 and biases the die or chip scale package against the interconnect 20A. The force applying mechanism 78 includes a pressure plate 80, a spring 82 and a clamp member 84. The clamp member 84 comprises clips that attach to openings 86 in the base 76.

In addition, the temporary package 72 includes terminal contacts 88 that electrically connect to the testing apparatus 74. The terminal contacts 88 are in electrical communication with bond wires 90 that provide conductive paths from the testing circuitry 56 to the contact members 22A on the interconnect 20A. Further details of the temporary package 72 are disclosed in U.S. Pat. No. 5,519,332, incorporated herein by reference.

Testing Method

Referring again to FIGS. 8A and 8B, a representative test sequence for the wafer level system 50W is as follows. Initially the testing apparatus 54 can be provided. The interconnect 20B or 20C can be mounted to the testing apparatus 54. The testing apparatus 54 can then be operated to bias the interconnect 20B or 20C and wafer 52 together. The biasing member 66 functions as previously described to cushion the forces applied by the testing apparatus 54 to the interconnect 20B or 20C and to allow the contact members 22B or 22C to self planarize to the bumps 12 on the wafer 52. Test signals can then be applied by the testing circuitry 56 to the integrated circuits on the wafer 52.

With interconnect 20C configured to contact all of the dice on the wafer 52 at the same time, the test signals can be electronically switched, as required, to selected dice. With interconnect 20B configured to contact a portion of the dice on the wafer 52, stepping techniques can be used to step the interconnect 20C, or the wafer 52, such that the dice are tested in sequence. In addition, the mounting of the interconnect 20B or 20C to the probe card fixture 58, permits different interconnects to be easily interchanged for testing different types of wafers.

Referring again to FIGS. 9A and 9B, a representative test sequence for the die level system 50D is as follows. Initially the temporary package 72 and testing apparatus 74 can be provided. In addition, the interconnect 20A can be mounted to the package base 76 as previously described. For assembling the package 72 with the die 10 therein, the bumps 12 on the die 10 can be aligned with the contact members 22A on the interconnect 20A. This can be accomplished using an optical alignment apparatus as described in the previously cited U.S. Pat. No. 5,519,332. The aligned die 10 and interconnect 20A can then be placed in contact and the force applying mechanism 78 attached to the base 76.

The assembled temporary package 72 can then be placed within the testing apparatus 74. Mounted within the testing apparatus 74, test signals can be applied by the testing circuitry 56 to the integrated circuits contained on the die 10. Substantially the same test procedure can be used to test the chip scale packages 17A and 17B.

Thus the invention provides an improved interconnect for testing semiconductor dice having contact bumps. The interconnect is designed to provide a reliable electrical connection to the contact bumps within a specified size range, and with a minimal application of contact force. In addition, the contact members do not excessively deform the contact bumps or produce large pockets or voids in the contact bumps. Still further, the contact members aid is centering the contact bumps to the interconnect and help to planarize a height of the contact bumps.

While the invention has been described with reference to certain preferred embodiments, as will be apparent to those skilled in the art, certain changes and modifications can be made without departing from the scope of the invention as defined by the following claims.

What is claimed is:

1. A method for testing a semiconductor component with contact bumps comprising:

determining an average minimum diameter and an average maximum diameter of the contact bumps;

providing a plurality of contact members on a substrate, each contact member comprising an elongated recess covered with a conductive layer and having a peripheral edge configured to penetrate into the contact bumps, the peripheral edge having a width sized to contact first contact bumps on the component having the average minimum diameter and to contact second contact bumps on the component having the average maximum diameter, the peripheral edge having a length sized to allow the contact bumps to flow along the length into the recess;

placing the contact bumps and the contact members in electrical communication; and applying test signals to the component.

2. The method of claim 1 further comprising providing the recess with a sidewall and a blade protecting from the sidewall for penetrating the contact bumps.

3. The method of claim 1 further comprising providing the recess with a sidewall and a curved blade projecting from the sidewall having a radius of curvature substantially equal to a radius of curvature of the contact bumps.

4. The method of claim 1 wherein the component comprises an element selected from the group consisting of bumped semiconductor dice, semiconductor wafers and chip scale packages.

5. The method of claim 1 wherein the recess comprises a stepped sidewall with a second peripheral edge.

6. A method for testing a semiconductor component with contact bumps, comprising:

providing a temporary package for retaining the component and configured for electrical communication with testing circuitry;

mounting a substrate to the temporary package comprising a plurality of contact members for receiving the contact bumps, each contact member comprising a recess in the substrate, a blade projecting from a sidewall of the recess for penetrating a contact bump, and a conductive layer at least partially covering the recess and the blade, the blade having a radius of curvature substantially equal to a radius of curvature of the contact bump; and applying test signals through the contact members and the contact bumps to the component.

7. The method of claim 6 wherein the component comprises an element selected from the group consisting of bumped semiconductor dice, semiconductor wafers and chip scale packages.

8. The method of claim 6 wherein each contact member comprises a plurality of blades projecting from the sidewall.

9. The method of claim 6 wherein the blade has a height that is less than or equal to a depth of the recess.

10. The method of claim 6 wherein the recess and the blade comprise etched members in the substrate.

11. A method for testing a semiconductor wafer with contact bumps comprising:

providing an interconnect for establishing temporary electrical communication with the contact bumps, the interconnect comprising a plurality of contact members, each contact member comprising a recess formed in a substrate and at least partially covered with a conductive layer, the recess comprising a sidewall and a blade projecting from the sidewall configured to penetrate a contact bump within the recess, the blade having a surface contour substantially matching a surface contour of the contact bump;

mounting the interconnect to a wafer handler;

aligning the interconnect with the wafer;

biasing the interconnect against the wafer; and applying test signals through the interconnect to the wafer.

12. The method of claim 11 wherein the recess comprises a plurality of blades.

13. The method of claim 11 wherein a height of the blade is equal to or less than a depth of the recess.

14. A method for testing a semiconductor component with contact bumps comprising:

providing testing circuitry;

providing an interconnect for establishing electrical communication between the contact bumps and the testing circuitry, the interconnect comprising a substrate and a plurality of contact members in the substrate for receiving the contact bumps, each contact member comprising a recess in the substrate at least partially covered with a conductive layer, the recess comprising a stepped sidewall having a first peripheral edge and a second peripheral edge for penetrating a contact bump within the recess;

placing the contact members in electrical communication with the contact bumps and with the testing circuitry; and applying test signals through the contact members and the contact bumps to the component.

15. The method of claim 14 wherein the first peripheral edge has a generally rectangular shape.

16. The method of claim 14 wherein the first peripheral edge is sized to contact first contact bumps on the component having an average minimum diameter and to contact second contact bumps on the component having an average maximum diameter.

17. The method of claim 14 wherein the component comprises an element selected from the group consisting of wafers, packages and dice.

18. A method for testing a semiconductor component with contact bumps comprising:

determining an average minimum diameter and an average maximum diameter of the contact bumps;

providing an interconnect for establishing electrical communication between the component and testing circuitry, the interconnect comprising:

a substrate;

a recess in the substrate having a sidewall sized to contact first contact bumps on the component having the average minimum diameter and to contact second contact bumps on the component having the average maximum diameter, a blade in the recess projecting from the sidewall and configured to penetrate oxide layers on the contact bumps;

a conductive layer at least partially covering the recess and the blade; and a conductor on the substrate in electrical communication with the conductive layer; and applying test signals through the interconnect to the component.

19. The method of claim 18 wherein the blade has a first radius of curvature substantially equal to a second radius of curvature of the contact bumps.

20. The method of claim 18 wherein the recess has a generally rectangular shape sized to contact the contact bumps along a first axis and to allow the contact bumps to flow along a second axis into the recess.

* * * * *

UNITED STATES PATENT AND TRADEMARK OFFICE
CERTIFICATE OF CORRECTION

PATENT NO. : 6,232,243 B1
DATED : May 15, 2001
INVENTOR(S) : Warren M. Farnworth; Derek Gochnour; Salman Akram It is certified that error appears in the above-identified patent and that said Letters Patent is hereby corrected as shown below:

<u>Column 12, claim 2,</u>
Line 40, change "protecting" to -- projecting --.

Signed and Sealed this

Thirteenth Day of November, 2001

*Attest:*

NICHOLAS P. GODICI
*Attesting Officer*  *Acting Director of the United States Patent and Trademark Office*